(12) United States Patent
Wang et al.

(10) Patent No.: US 12,199,103 B2
(45) Date of Patent: Jan. 14, 2025

(54) DISPLAY PANEL

(71) Applicants: Chengdu BOE Optoelectronics Technology Co., Ltd., Chengdu (CN); BOE TECHNOLOGY GROUP CO., LTD., Beijing (CN)

(72) Inventors: Qingsong Wang, Beijing (CN); Liqiang Chen, Beijing (CN); Jiafan Shi, Beijing (CN); Yang Yang, Beijing (CN); Peng Hou, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/639,444

(22) PCT Filed: Apr. 29, 2021

(86) PCT No.: PCT/CN2021/090949
§ 371 (c)(1),
(2) Date: Mar. 1, 2022

(87) PCT Pub. No.: WO2022/226884
PCT Pub. Date: Nov. 3, 2022

(65) Prior Publication Data
US 2024/0096900 A1    Mar. 21, 2024

(51) Int. Cl.
*H01L 27/12* (2006.01)
*G09G 3/00* (2006.01)

(52) U.S. Cl.
CPC ......... *H01L 27/1218* (2013.01); *G09G 3/035* (2020.08); *H01L 27/124* (2013.01)

(58) Field of Classification Search
CPC ... H01L 27/1218; H01L 27/124; G09G 3/035; G09F 9/30
See application file for complete search history.

(56) References Cited

U.S. PATENT DOCUMENTS

| | | | |
|---|---|---|---|
| 10,192,896 B2* | 1/2019 | Kim | H01L 27/1218 |
| 11,335,739 B2 | 5/2022 | Yu et al. | |

(Continued)

FOREIGN PATENT DOCUMENTS

| | | |
|---|---|---|
| CN | 206685061 U | 11/2017 |
| CN | 108231800 A | 6/2018 |

(Continued)

OTHER PUBLICATIONS

Chinese International Search Report in PCT/CN2021/090949 mailed Feb. 8, 2022 in Chinese.

(Continued)

*Primary Examiner* — David Vu
(74) *Attorney, Agent, or Firm* — Collard & Roe, P.C.; William Collard

(57) ABSTRACT

A display panel is provided, including a display region and a bending region at a side of the display region, a base substrate the base substrate includes a first flexible substrate and a second flexible substrate stacked on each other; the display region includes a driver circuit layer, the driver circuit layer is at a side of the second flexible substrate away from the first flexible substrate and includes at least one first wiring, the bending region includes at least one second wiring, and the at least one second wiring is electrically connected with the at least one first wiring; the at least one second wiring is between the first flexible substrate and the second flexible substrate. The display panel has high reliability, narrow bezel, and large screen.

20 Claims, 11 Drawing Sheets

(56) References Cited

U.S. PATENT DOCUMENTS

| | | | | |
|---|---|---|---|---|
| 2015/0382446 | A1* | 12/2015 | Kwon | G06F 1/1643 |
| | | | | 174/251 |
| 2018/0145124 | A1 | 5/2018 | Kim et al. | |
| 2019/0373719 | A1* | 12/2019 | Lee | H10K 59/873 |
| 2020/0127220 | A1* | 4/2020 | Kim | H10K 59/131 |
| 2020/0341516 | A1 | 10/2020 | Huang et al. | |
| 2021/0012687 | A1 | 1/2021 | Li et al. | |
| 2021/0336166 | A1 | 10/2021 | Wen | |
| 2021/0391398 | A1 | 12/2021 | Ouyang et al. | |
| 2022/0011637 | A1 | 1/2022 | Yin | |

FOREIGN PATENT DOCUMENTS

| | | |
|---|---|---|
| CN | 108878482 A | 11/2018 |
| CN | 109658831 A | 4/2019 |
| CN | 109712932 A | 5/2019 |
| CN | 109755412 A | 5/2019 |
| CN | 110211490 A | 9/2019 |
| CN | 110335875 A | 10/2019 |
| CN | 110379309 A | 10/2019 |
| CN | 110610968 A | 12/2019 |
| CN | 110867477 A | 3/2020 |
| CN | 111048566 A | 4/2020 |
| CN | 111063256 A | 4/2020 |
| CN | 111326560 A | 6/2020 |
| CN | 111463243 A | 7/2020 |
| CN | 111599845 A | 8/2020 |
| CN | 111710691 A | 9/2020 |
| CN | 111727505 A | 9/2020 |
| CN | 112331677 A | 2/2021 |
| CN | 112542499 A | 3/2021 |
| IN | 110571239 A | 12/2019 |

OTHER PUBLICATIONS

Written Opinion of PCT/CN2021/090949 mailed Feb. 8, 2022 Chinese.

Chinese Office Action in Chiinese Application No. 202180000982.2 dated Oct. 24, 2024 with English translation.

* cited by examiner

DISPLAY PANEL

CROSS REFERENCE TO RELATED APPLICATIONS

This application is the National Stage of PCT/CN2021/090949 filed on Apr. 29, 2021, the disclosure of which is incorporated by reference.

TECHNICAL FIELD

Embodiments of the present disclosure relate to a display panel.

BACKGROUND

With continuous progress of display technology and manufacturing technology and people's growing experience demand, the display panel is gradually developed towards large screen and full screen. In a manufacturing process of a display panel, the bending region may be disposed at a side of a display region of the display substrate, and a non-display part around the display region can be bent to a non-display side of the display substrate by the bending region, so as to reduce the area of the non-display part at a display side, increase the screen ratio and improve the visual experience effect, and realize large screen and full screen of the display panel.

SUMMARY

At least one embodiment of the present disclosure provides a display panel, comprising a display region and a bending region at a side of the display region, and a base substrate, wherein the base substrate comprises a first flexible substrate and a second flexible substrate stacked on each other; the display region comprises a driver circuit layer, the driver circuit layer is at a side of the second flexible substrate away from the first flexible substrate and comprises at least one first wiring, the bending region comprises at least one second wiring, and the at least one second wiring is electrically connected with the at least one first wiring, and the at least one second wiring is between the first flexible substrate and the second flexible substrate.

For example, in the display panel provided in at least one embodiment of the present disclosure, the at least one second wiring is at a position of a neutral layer in the bending region when the bending region is in a bending state.

For example, in the display panel provided in at least one embodiment of the present disclosure, the base substrate further comprises a buffer layer between the first flexible substrate and the second flexible substrate, the buffer layer includes a first hollow part at least partially in the bending region, and the at least one second wiring is between the buffer layer and the second flexible substrate and extends to pass through the first hollow part.

For example, the display panel provided in at least one embodiment of the present disclosure further comprises a first peripheral region between the display region and the bending region, the second flexible substrate includes a via hole in the first peripheral region, and the at least one first wiring is electrically connected with the at least one second wiring through the via hole.

For example, the display panel provided in at least one embodiment of the present disclosure further comprises a second peripheral region on a side of the bending region away from the display region, the second wiring passes through the bending region and extends to the second peripheral region.

For example, in the display panel provided in at least one embodiment of the present disclosure, the driver circuit layer comprises a thin film transistor and a storage capacitor, the thin film transistor comprises a gate electrode and source and drain electrodes, and the storage capacitor comprises a first capacitor electrode and a second capacitor electrode; the second capacitor electrode is on a side of the first capacitor electrode away from the base substrate, and the source and drain electrodes is on a side of the second capacitor electrode away from the base substrate; and the at least one first wiring and the source and drain electrodes are provided in a same layer.

For example, in the display panel provided in at least one embodiment of the present disclosure, the first peripheral region comprises a first connection electrode in a same layer as the first capacitor electrode, and the at least one first wiring is electrically connected with the at least one second wiring through the via hole comprises: the at least one first wiring is electrically connected with the first connection electrode, and the first connection electrode is electrically connected with the at least one second wiring through the via hole; or, the first peripheral region comprises a second connection electrode in a same layer as the second capacitor electrode, and the at least one first wiring is electrically connected with the at least one second wiring through the via hole comprises: the at least one first wiring is electrically connected with the second connection electrode, and the second connection electrode is electrically connected with the at least one second wiring through the via hole; or, the first peripheral region comprises a first connection electrode in a same layer as the first capacitor electrode, and a second connection electrode in a same layer as the second capacitor electrode, and the at least one first wiring is electrically connected with the at least one second wiring through the via hole comprises: the at least one first wiring is electrically connected with the second connection electrode, the second connection electrode is electrically connected with the first connection electrode, and the first connection electrode is electrically connected with the at least one second wiring through the via hole.

For example, in the display panel provided in at least one embodiment of the present disclosure, a thickness of the second flexible substrate is smaller than a thickness of the first flexible substrate in a direction perpendicular to a plate surface of the base substrate.

For example, in the display panel provided in at least one embodiment of the present disclosure, the thickness of the second flexible substrate is in a range of 6 µm-10 µm, and the thickness of the first flexible substrate is in a range of 9 µm-11 µm.

For example, in the display panel provided in at least one embodiment of the present disclosure, an elastic modulus of the first flexible substrate is same as an elastic modulus of the second flexible substrate, and the elastic modulus is in a range of 6.5 Gpa-10.5 Gpa.

For example, in the display panel provided in at least one embodiment of the present disclosure, the at least one second wiring comprises one or more materials selected from a group consisting of titanium, aluminum, copper, and molybdenum.

For example, the display panel provided in at least one embodiment of the present disclosure further comprises a light emitting device layer, an encapsulation layer, a first optical transparent adhesive layer, and a polarizer. The light emitting device layer is on a side of the driver circuit layer away from the base substrate, and the encapsulation layer is on a side of the light emitting device layer away from the base substrate, in the display region, the polarizer is bonded to a side of the encapsulation layer away from the base substrate by the first optical transparent adhesive layer, and the first optical transparent adhesive layer extends to the bending region; the first optical transparent adhesive layer comprises polymethyl methacrylate.

For example, in the display panel provided in at least one embodiment of the present disclosure, a thickness of the first optical transparent adhesive layer is in a range of 27 µm-33 µm in a direction perpendicular to a plate surface of the base substrate.

For example, the display panel provided in at least one embodiment of the present disclosure further comprises a back film on a side of the first flexible substrate away from the second flexible substrate, the back film includes a second hollow part at least partially in the bending region.

For example, in the display panel provided in at least one embodiment of the present disclosure, in a direction parallel to a plate surface of the base substrate, the first optical transparent adhesive layer extends to a position between an edge of the first hollow part away from the display region and an edge of the second hollow part away from the display region.

For example, in the display panel provided in at least one embodiment of the present disclosure, an interlayer insulation layer is provided in at least part of the first peripheral region and the bending region, and between the first optical transparent adhesive layer and the second flexible substrate; the display region further comprises: a planarization layer on a side of the driver circuit layer away from the second flexible substrate; and a pixel definition layer on a side of the planarization layer away from the second flexible substrate. The light emitting device layer comprises a plurality of light emitting devices, each of the light emitting devices comprises a first electrode, a light emitting layer, and a second electrode that are sequentially stacked in a direction away from the base substrate, the driver circuit layer comprises a plurality of pixel driver circuits, the first electrode is electrically connected with one of the pixel driver circuits through a via hole in the planarization layer, the pixel definition layer is at a side of the first electrode away from the base substrate and comprises a plurality of pixel openings, the plurality of pixel openings respectively expose the first electrodes of the plurality of light emitting devices, and the light emitting layers of the plurality of light emitting devices are respectively in the plurality of pixel openings; and the interlayer insulation layer is in a same layer as at least one of the planarization layer and the pixel definition layer.

For example, in the display panel provided in at least one embodiment of the present disclosure, the first optical transparent adhesive layer directly contacts the second flexible substrate in at least part of the first peripheral region and the bending region.

For example, the display panel provided in at least one embodiment of the present disclosure further comprises a second peripheral region on a side of the bending region away from the display region, the first optical transparent adhesive layer extends into the second peripheral region.

For example, in the display panel provided in at least one embodiment of the present disclosure, the first optical transparent adhesive layer is retracted by at least 0.2 mm relative to an edge of the base substrate.

For example, the display panel provided in at least one embodiment of the present disclosure further comprises a second optical transparent adhesive layer and a cover plate, the cover plate is bonded to the polarizer through the second optical transparent adhesive layer, and covers the display region and at least part of the bending region.

For example, in the display panel provided in at least one embodiment of the present disclosure, the second optical transparent adhesive layer is retracted by at least 0.2 mm relative to an edge of the polarizer near the bending region.

At least one embodiment of the present disclosure also provides a method of manufacturing a display panel, the display panel comprises a display region and a bending region on a side of the display area, the manufacturing method includes: providing a base substrate. The base substrate comprises a stacked first flexible substrate and a second flexible substrate; a driving circuit layer is formed in the display region, the driving circuit layer is formed on a side of the second flexible substrate away from the first substrate, and includes at least one first wiring; and at least one second wiring formed in the bending region, the at least one second wiring and the at least one first wiring are electrically connected with each other; and the at least one second wiring is formed between the first flexible substrate and the second flexible substrate.

For example, the manufacturing method provided by at least one embodiment of the present disclosure further comprises: bonding a polarizer to the base substrate through a first optical transparent adhesive layer.

For example, the manufacturing method provided by at least one embodiment of the present disclosure further comprises: bending the bending region, and then curing the first optical transparent adhesive layer.

For example, in the manufacturing method provided in at least one embodiment of the present disclosure, curing the first optical transparent adhesive layer includes: curing the first optical transparent adhesive layer by light curing; or curing the first optical transparent adhesive layer by spraying a catalyst on the surface of the optical transparent adhesive layer to cure the first optical transparent adhesive layer.

BRIEF DESCRIPTION OF THE DRAWINGS

In order to clearly illustrate the technical solution of the embodiments of the disclosure, the drawings of the embodiments will be briefly described in the following; it is apparent that the described drawings are only related to some embodiments of the disclosure and thus are not limitative of the disclosure.

DETAILED DESCRIPTION

Figure 1:
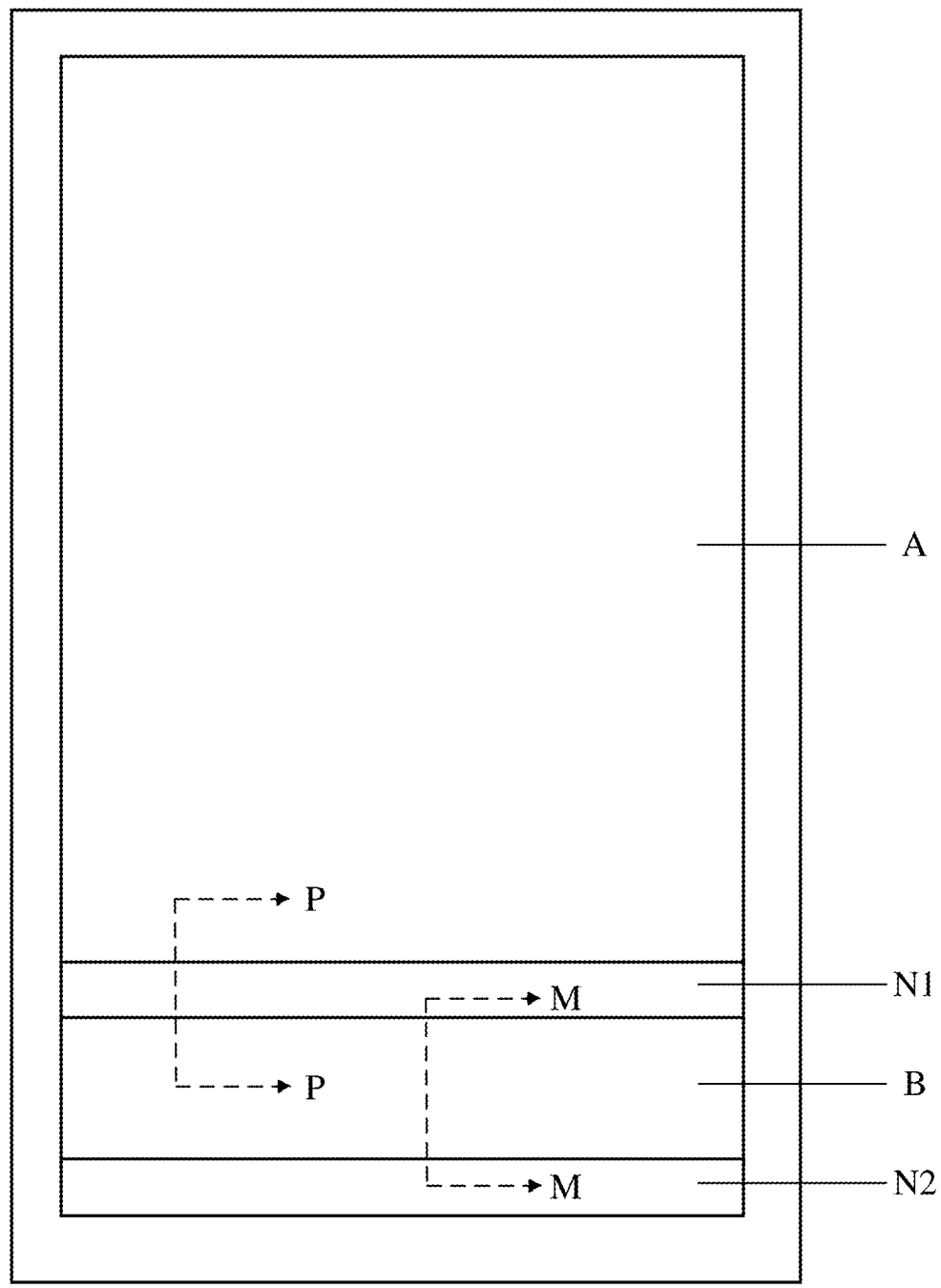
FIG. 1 is a schematic planar view of a display panel provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude other elements or objects. The phrases "connect/connecting", "connected", etc., are not intended to be limited to a physical connection or mechanical connection, it may comprise an electrical connection, directly or indirectly. "On," "under," "left," "right" and the like are only used to indicate relative position relationship, and when the absolute position of the object which is described is changed, the relative position relationship may be changed accordingly.

In the design of realizing a narrow bezel and a large screen of the display panel by bending a frame of a module product, a plurality of metal wirings are arranged in a bending region located at a side of a display region of the display substrate, and these metal wirings extend through the bending parts of the bending region to electrically connect a driver circuit in the display region to a processor circuit, such as a data driver circuit, a driver IC (such as timing controller), etc., located at a non-display side of the display substrate. In this design, the plurality of metal wirings in the bending region need to be bent, so the bending performance (such as tensile performance, bending radius, etc.) of the plurality of metal wirings is the important factor to realize reliable bending.

In some embodiments, stress subjected by the plurality of metal wirings in the bending process can be reduced by shape design (such as a folding line design or a hollow design) of the plurality of metal wirings in the bending region. Because the display products require further narrowing of the frame, the bending radius of the bending region is required to be smaller and smaller, which requires some other designs to further improve the bending performance of the plurality of metal wirings in the bending region to prevent the metal wirings from being broken.

At least one embodiment of that present disclosure provide a display panel, the display panel includes a display region and a bending region at a side of the display region, and the display panel further includes a base substrate, the base substrate includes a first flexible substrate and a second flexible substrate that are stacked on each other. The display region includes a driver circuit layer, the driver circuit layer is at a side of the second flexible substrate away from the first flexible substrate and includes at least one first wiring, the bending region includes at least one second wiring, and the at least one second wiring is electrically connected with the at least one first wiring; and the at least one second wiring is disposed between the first flexible substrate and the second flexible substrate.

In the display panel provided by at least one embodiment of the present disclosure, after the bending region is bent, the at least one second wiring in the bending region is near or located at a position of a neutral layer, so that stress subjected by at least one second wiring can be reduced or eliminated, thereby reducing or eliminating the risk of breakage of the at least one second wiring, and improving the reliability and production yield of the display panel.

In the stack structure, the neutral layer is a transition layer which is neither pulled nor pressed when the stack structure is bent, so stress subjected by the neutral layer in the process of bending the stack structure is almost equal to zero. For example, in the stack structure, the specific position of the neutral layer may be affected by the elastic modulus, thickness, and stack order of each layer in the stack structure, so the specific position of the neutral layer can be adjusted by changing these factors.

In the following, the display panel provided by the embodiments of the present disclosure and a manufacturing method thereof are introduced in detail by several specific examples.

Figure 2:
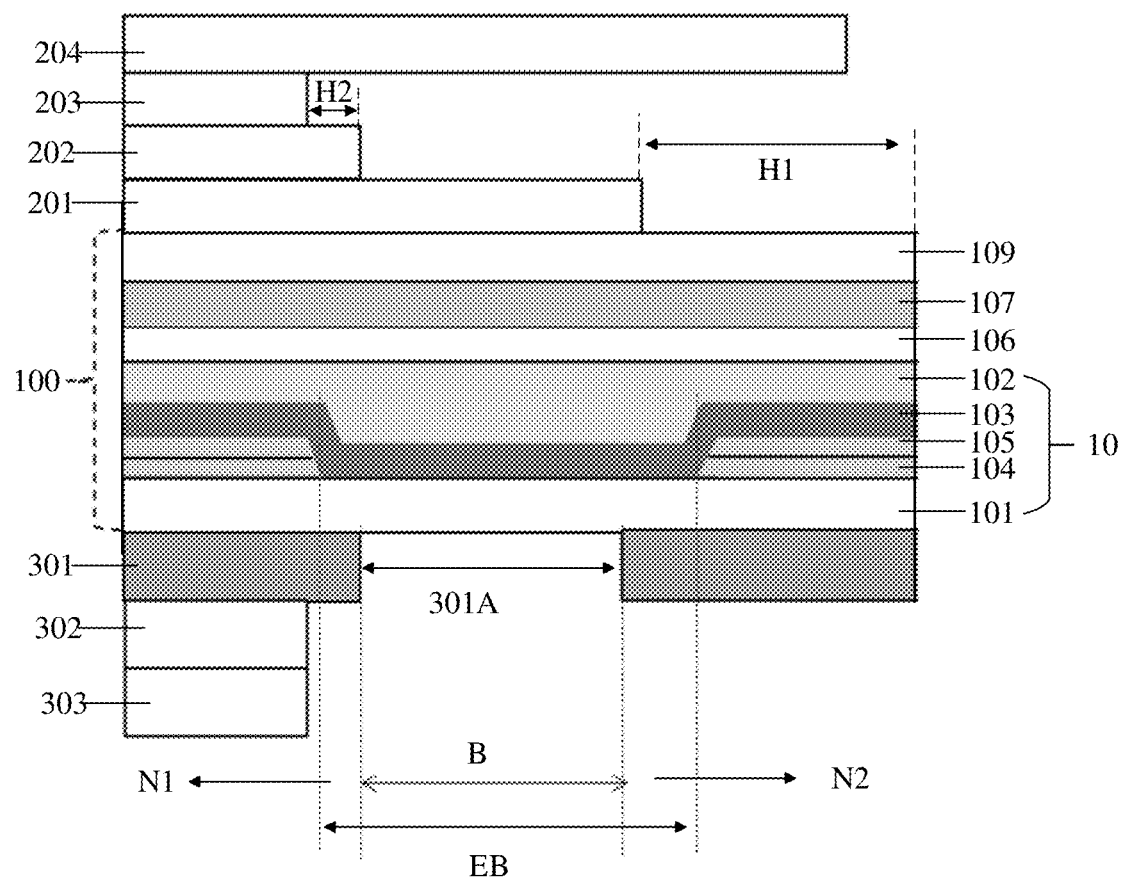
FIG. 2 is a schematic sectional view of the display panel in FIG. 1 taken along the line MM.
Figure 3:
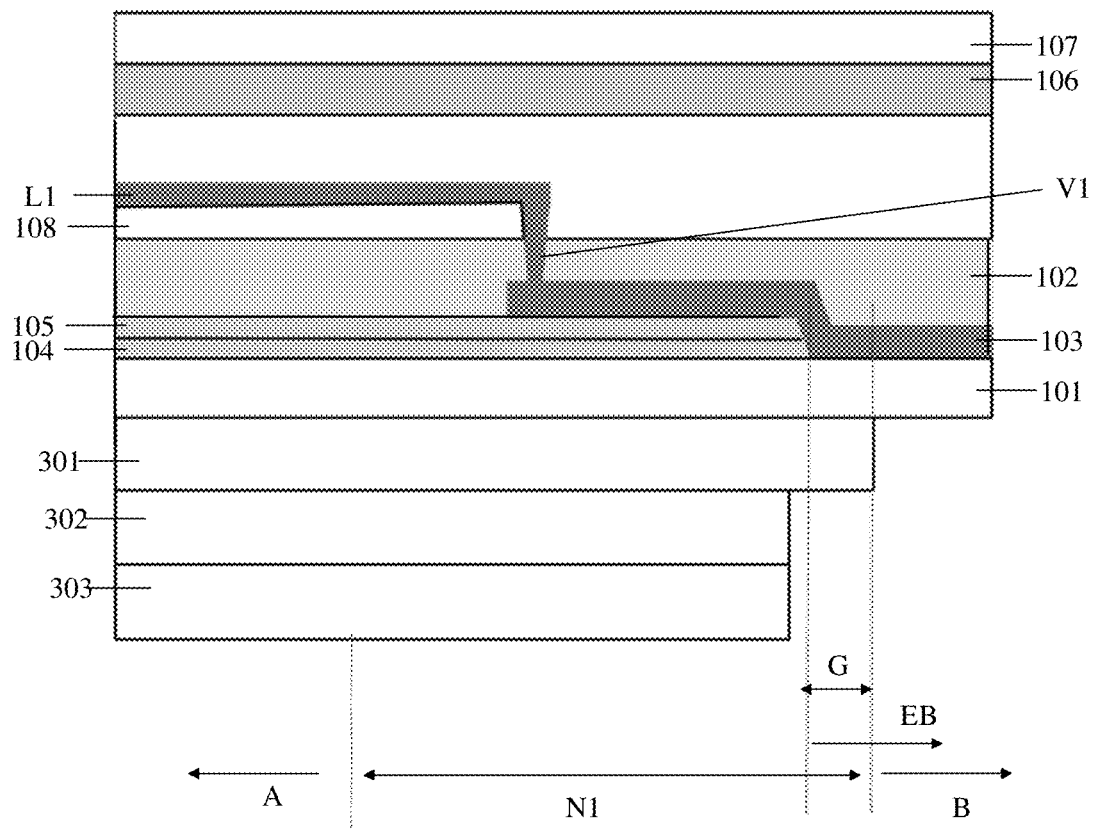
FIG. 3 is a schematic sectional view of the display panel in FIG. 1 taken along the line PP.

At least one embodiment of the present disclosure provides a display panel, FIG. 1 shows a schematic planar view of the display panel, FIG. 2 shows a schematic sectional view of the display panel in FIG. 1 taken along the line MM, and FIG. 3 shows a schematic sectional view of the display panel in FIG. 1 taken along the line PP.

As shown in FIGS. 1-3, the display panel includes a display region A and a bending region B located at a side of the display region A, and includes a base substrate 10; the base substrate 10 includes a first flexible substrate 101 and a second flexible substrate 102 that are stacked on each other; the display region A includes a driver circuit layer, the driver circuit layer includes, for example, a thin film transistors and a storage capacitor, etc., which will be described in detail later. The driver circuit layer is arranged on a side of the second flexible substrate 102 away from the first substrate 101 and includes at least one first wiring L1. As shown in FIG. 3, the bending region B includes at least one second wiring 103, and the at least one second wiring 103 is electrically connected with the at least one first wiring L1. In the above-mentioned stack structure included in the base substrate 10, the at least one second wiring 103 is disposed between the first flexible substrate 101 and the second flexible substrate 102.

For example, in some embodiments, the at least one first wiring L1 includes a plurality of first wirings L1, and the at least one second wiring 103 includes a plurality of second wirings 103, and the plurality of first wirings L1 are electrically connected with the plurality of second wirings 103 in one-to-one correspondence.

For example, when the bending region B is in a bending state, the at least one second wiring 103 is near or located at a position of the neutral layer in the bending region B, so that when the bending region B is in the bending state, stress subjected by the at least one second wiring 103 is very small, for example, the stress almost equal to zero, thereby preventing the at least one second wiring 103 from being broken and improving the reliability of the display panel. In addition, the first flexible substrate 101 and the second flexible substrate 102 have a function of blocking water and oxygen, and can protect the second wiring 103 from corrosion and other defects.

For example, in some embodiments, as shown in FIG. 2 and FIG. 3, the base substrate 10 may further include a buffer layer between the first flexible substrate 101 and the second flexible substrate 102. For example, in some examples, the buffer layer may include a first buffer sublayer 104 and a second buffer sublayer 105. For example, the first buffer sublayer 104 and the second buffer sublayer 105 may include an inorganic material, such as silicon oxide, silicon nitride or silicon oxynitride. The material of the first buffer sublayer 104 and the material of the second buffer sublayer 105 may be the same or different. For example, in some examples, the material of the first buffer sublayer 104 is silicon oxide, and the material of the second buffer sublayer 105 is silicon nitride. The buffer layer can prevent impurities such as water and oxygen, etc. from the first flexible substrate 101 penetrating into the functional structures on the first flexible substrate 101, thus protecting the functional structures (such as the second wiring 103 shown in FIG. 2 and FIG. 3) on the first flexible substrate 101.

For example, as shown in FIG. 2, the buffer layer includes a first hollow part EB at least partially located in the bending region B, and the at least one second wiring 103 is arranged between the buffer layer and the second flexible substrate 102 and extends to pass through the first hollow part EB. In this case, because the material of the buffer layer in the first hollow part EB is removed, no buffer layer part is under the at least one second wiring 103 in the first hollow part EB. For example, all the part of the buffer layer located in the bending region B is the first hollow part EB. For example, a range of the first hollow part EB is larger than that of the bending region B, that is, it is shown in FIG. 2 that a width of the first hollow part EB in a horizontal direction is larger than that of the bending region B in a horizontal direction. For example, in some examples, as shown in FIG. 3, a distance between an edge of the first hollow part EB and a corresponding edge of the bending region B is G, the distance G may range from 100 μm to 150 μm, such as 120 μm or 130 μm. Because the material flexibility of the buffer layer (for example, the first buffer sublayer 104 and the second buffer sublayer 105) is poor, the buffer layer can be prevented from being broken in the bending process by providing the hollow part in the buffer layer, thus preventing the second wiring 103 from being broken, improving the flexibility of the bending region B, and facilitating reliable bending of the bending region B.

For example, as shown in FIG. 1 and FIG. 3, in some embodiments, the display panel further includes a first peripheral region N1 between the display region A and the bending region B, the second flexible substrate 102 includes a plurality of via holes V1 in the first peripheral region N1, and the at least one first wiring L1 and the at least one second wiring 103 are electrically connected by a single via hole V1 or a plurality of via holes V1. For example, a side of the second flexible substrate 102 away from the first flexible substrate 101 is provided with a barrier layer 108, the first wiring L1 is provided on a side of the barrier layer 108 away from the second flexible substrate 102, and the via holes V1 are located on a side of the barrier layer 108 near the bending region B. For example, the barrier layer 108 may include a material, such as silicon oxide, silicon nitride, or silicon oxynitride, etc.

For example, as shown in FIG. 1, in some embodiments, the display panel further includes a second peripheral region N2 located on a side of the bending region B away from the display region A, and the second wiring 103 passes through the bending region B to extend to the second peripheral region N2.

Figure 4:
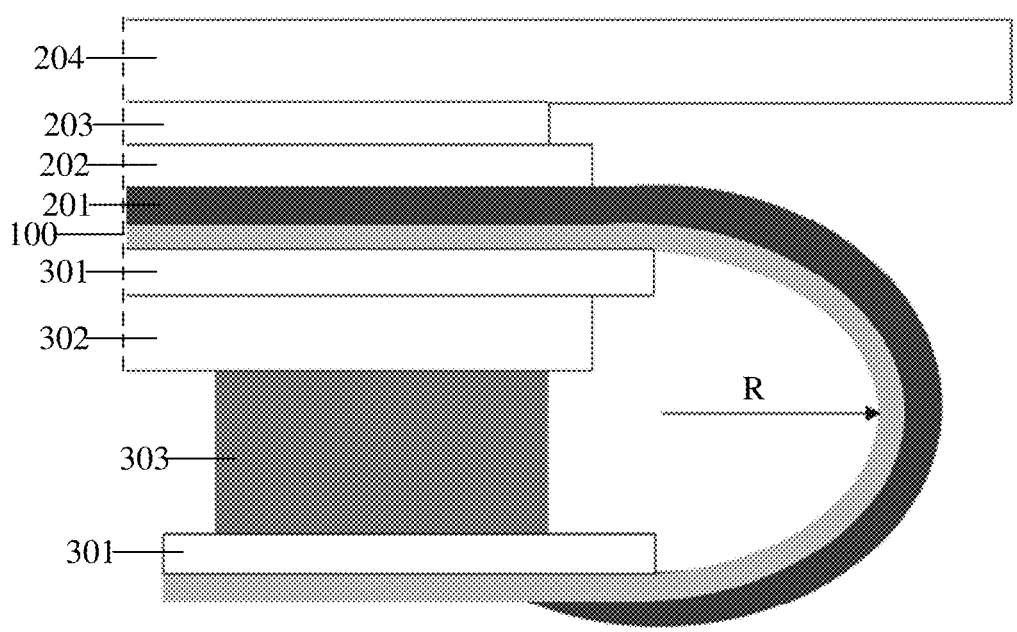
FIG. 4 is a schematic sectional view of the display panel in FIG. 2 after a bending region is bent.

For example, FIG. 4 shows a schematic diagram of the display panel after the bending region B is bent. As shown in FIG. 4, after the bending region B is bent, the second peripheral region N2 is on a non-display side of the display panel. For example, a non-display side of the display panel may include processor circuits, such as a data driver circuit, a driver IC (such as a timing controller). In this way, by the bending of the bending region B, the first wiring L1 can sequentially pass through the first peripheral region N1, the bending region B and the second peripheral region N2 by the second wiring 103 to be electrically connected with the processor circuit, so that the driver circuit in the display region A can be controlled and operated by the processor circuit, and the display operation and display state of the display panel can be controlled.

For example, the display region A includes a pixel array, the pixel array includes a plurality of sub-pixels arranged in an array, and each of the plurality of sub-pixels includes a light emitting device and a pixel driver circuit located in the driver circuit layer. For example, FIG. 5 shows a partial sectional schematic diagram of one sub-pixel.

Figure 5:
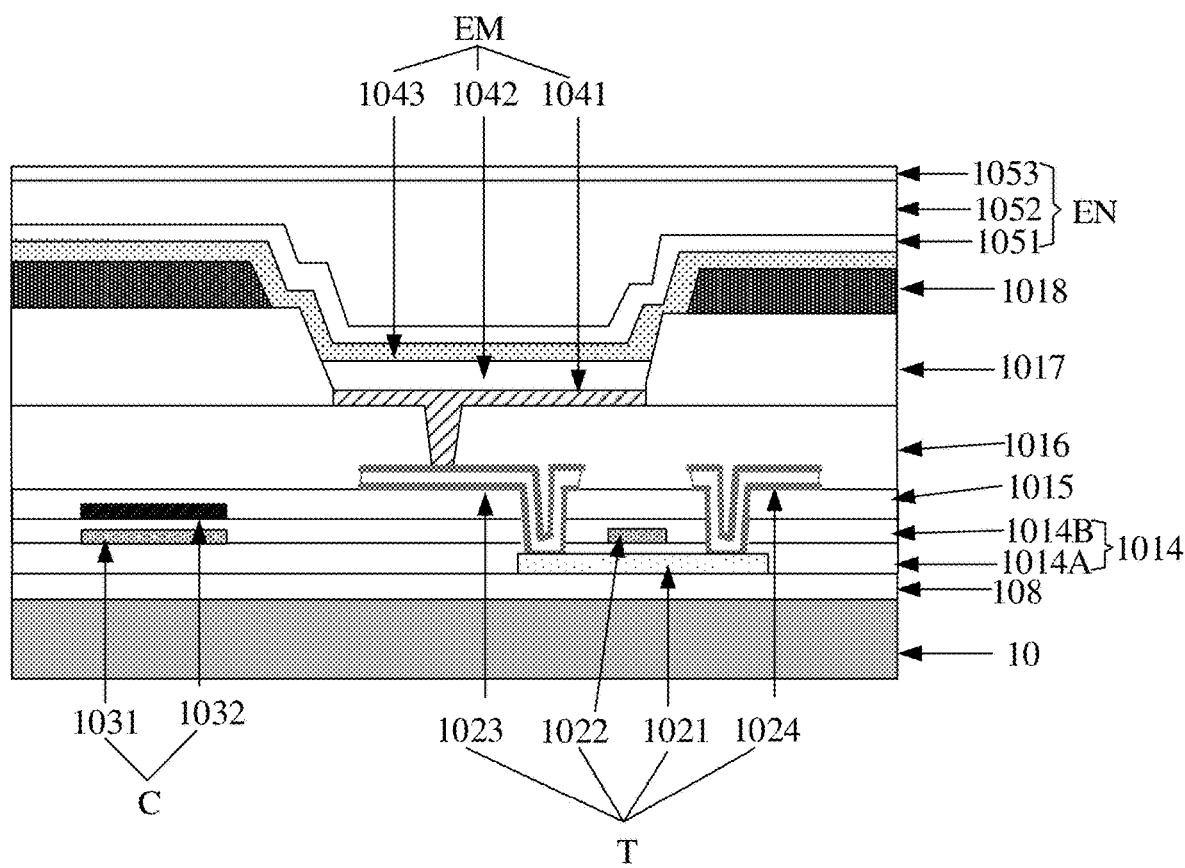
FIG. 5 is a partial sectional view of a sub-pixel in the display region of the display panel in FIG. 1.

For example, as shown in FIG. 5, the pixel driver circuit at least includes a thin film transistor T and a storage capacitor C. The thin film transistor includes a gate electrode 1022 and source and drain electrodes (one of the reference numerals 1023 and 1024 in FIG. 5 is the source electrode and the other is the drain electrode; in the following introduction, as an example, the numeral 1023 represents the source electrode and the numeral 1024 represents the drain electrode), and the storage capacitor C includes a first capacitor electrode 1031 and a second capacitor electrode 1032; the second capacitor electrode 1032 is disposed on a side of the first capacitor electrode 1031 away from the base substrate 10, and the source and drain electrodes are disposed on a side of the second capacitor electrode 1032 away from the base substrate 10. For example, the at least one first wiring L1 is arranged in a same layer as the source and drain electrodes.

It is to be noted that, in the embodiments of the present disclosure, the term "in a same layer" refers to that the two functional layers or structural layers are in a same layer and formed of a same material in the hierarchical structure of the display substrate, that is, in the manufacturing process of the display panel, the two functional layers or structural layers may be formed of the same material layer, and the required patterns and structures may be formed by a same patterning process.

For example, in some examples, the at least one first wiring L1 may be a data line electrically connected with the drain electrode 1024, thereby providing a data signal for the pixel driver circuit. For example, in other examples, the at least one first wiring L1 may also be a power line (for example, a power line VDD configured to provide a high-level signal or a power line VSS configured to provide a low-level signal) or other wirings, such as scanning lines, and the embodiments of the present disclosure do not limit the specific type of the at least one first wiring L1.

For example, as shown in FIG. 5, the thin film transistor T of the pixel driver circuit further includes an active layer 1021, a gate electrode 1022, a gate insulation layer 1014 (for example, the thin film transistor T includes a first gate insulation layer 1014A and a second gate insulation layer 1014B), an interlayer insulation layer 1015 and other structures; the active layer 1021, the first gate insulation layer 1014A, the gate electrode 1022, the second gate insulation layer 1014B, and the interlayer insulation layer 1015 are sequentially arranged in a direction away from the base substrate 10.

For example, the pixel driver circuit may be formed into a 2T1C driver circuit (two thin film transistors, one storage capacitor), 6T1C driver circuit (six thin film transistors, one storage capacitor) and other structures, thus the pixel driver circuit includes a plurality of thin film transistors, and the plurality of thin film transistors have similar or same stacked structures as shown in FIG. 5, only the thin film transistors directly connected with the light emitting devices are shown in FIG. 5, and the thin film transistors may be driving thin film transistors, light emission control thin film transistors, etc.

In addition, it is to be noted that FIG. 5 shows an overall structure of the base substrate 10, but it does not show the specific stack structures of the base substrate 10, and the specific structures of the base substrate 10 can be referred to FIG. 2.

For example, the display region A further includes a planarization layer 1016 disposed on a side of the driver circuit layer away from the second flexible substrate 102 and a pixel definition layer 1017 disposed on a side of the planarization layer 1016 away from the second flexible substrate 102. The display region A further includes a light emitting device layer arranged on the side of the planarization layer 1016 away from the second flexible substrate 102. For example, the light emitting device layer includes a plurality of light emitting devices EM respectively corresponding to the plurality of sub-pixels, each light emitting device EM includes a first electrode 1041, a light emitting layer 1042, and a second electrode 1043 that are stacked sequentially in the direction away from the base substrate 10. The first electrode 1041 is connected with the pixel driver circuit (such as the source electrode 1043 of the thin film transistor T) through a via hole in the planarization layer 1016 The pixel definition layer 1017 is disposed on a side of the first electrode 1041 away from the base substrate 10, and the pixel definition layer 1017 includes a plurality of pixel openings that respectively expose the first electrodes 1041 of the plurality of the light emitting devices EM, and the light emitting layers 1042 of the plurality of light emitting devices EM are respectively disposed in the pixel openings.

Figure 6:
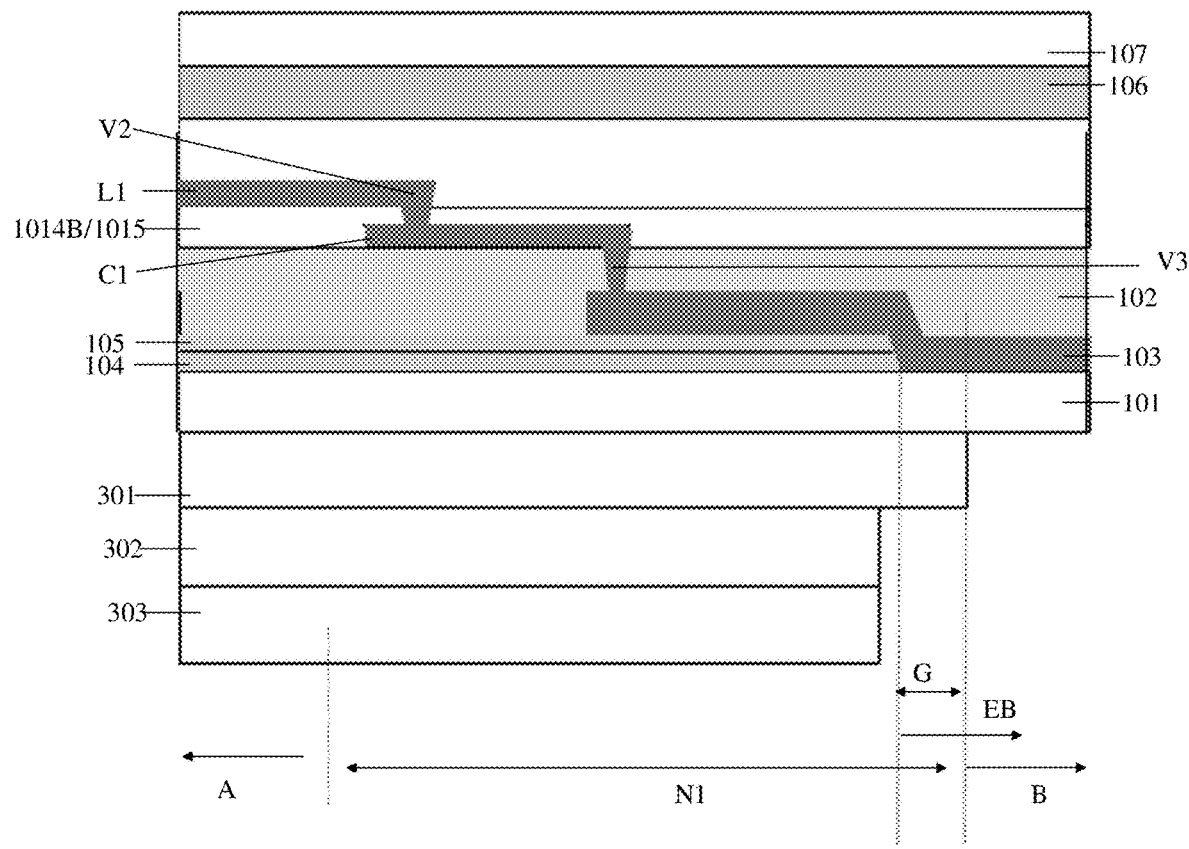
FIG. 6 is another sectional view of the display panel in FIG. 1 taken along the line PP.

For example, the first capacitor electrode plate 1031 is in a same layer as the gate electrode 1022, and the second capacitor electrode plate 1032 is between the gate insulation layer 1014 and the interlayer insulation layer 1015. For example, FIG. 6 is another schematic sectional view of the display panel in FIG. 1 taken along the line PP. In some examples, unlike the example shown in FIG. 2, as shown in FIG. 6, the first peripheral region N1 includes a first connection electrode C1 arranged in a same layer as the first capacitor electrode 1031. In this case, for example, the at least one first wiring L1 is electrically connected with the first connection electrode C1 through a via hole V2, and for example, the first connection electrode C1 is electrically connected with the at least one second wiring 103 through a via hole V3.

For example, a barrier layer may also be disposed between the first connection electrode C1 and the second flexible substrate 102, which is not shown in the drawings.

Figure 7:
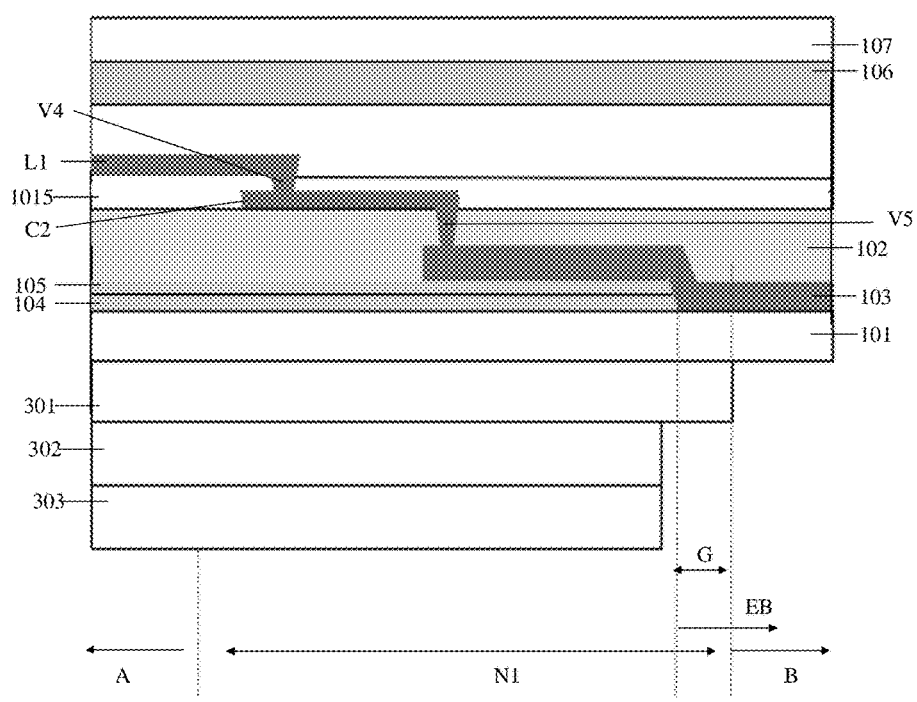
FIG. 7 is further another schematic sectional view of the display panel in FIG. 1 taken along the line PP.

Or, FIG. 7 is another schematic cross-sectional view of the display panel in FIG. 1 taken along the line PP. In other examples, unlike the examples shown in FIG. 2 and FIG. 6, as shown in FIG. 7, the first peripheral region N1 includes a second connection electrode C2 arranged in a same layer as the second capacitor electrode 1032. In this case, for example, the at least one first wiring L1 is electrically connected with the second connection electrode C2 through a via hole V4, and for example, the second connection electrode C2 is electrically connected with the at least one second wiring 103 through a via hole V5.

For example, a barrier layer may also disposed between the second connection electrode C2 and the second flexible substrate 102, which is not shown in the drawings.

Figure 8:
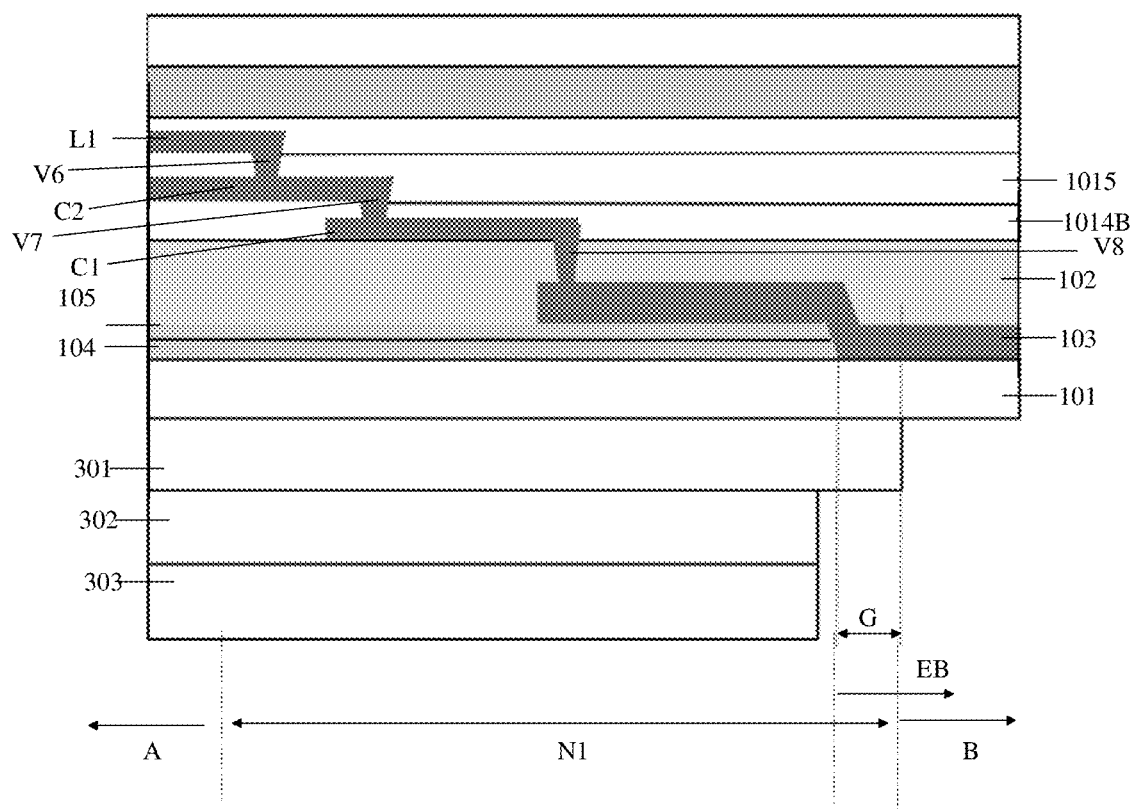
FIG. 8 is yet another schematic sectional view of the display panel in FIG. 1 taken along the line PP.

Or, FIG. 8 is another schematic cross-sectional view of the display panel in FIG. 1 taken along the line PP. In yet other examples, unlike the examples shown in FIGS. 2, 6 and 7, as shown in FIG. 8, the first peripheral region N1 includes a first connection electrode C1 which is arranged in a same layer as the first capacitor electrode 1031 and a second connection electrode C2 which is arranged in a same layer as the second capacitor electrode 1032. In this case, for example, the at least one first wiring L1 is electrically connected to the second connection electrode C2 through a via hole V6, for example, the second connection electrode C2 is electrically connected to the first connection electrode C1 through a via hole V7, and for example, the first connection electrode C1 is electrically connected to the at least one second wiring 103 through a via hole V8.

For example, a barrier layer may also be disposed between the first connection electrode C1 and the second flexible substrate 102, which is not shown in the drawings.

It is to be noted that, in order to show concisely, the encapsulation layer EN, the first optical transparent adhesive layer 201, the polarizer 202, the second optical transparent adhesive layer 203, the cover plate 204, etc. are not shown in FIG. 2 and FIGS. 6-8, and the stacking relationship of these structures can refer to other figures, which is not repeated here.

Through the above-mentioned step-by-step electrical connection, that is, the above-mentioned layer-by-layer electrical connection, it can avoid the bad connection caused by the direct connection of the at least one first wiring L1 and the at least one second wiring 103 due to large step difference (for example, a large distance difference of the distance between the at least first wiring L1 and the base substrate 10 and the distance between the at least second wiring 103 and the base substrate 10), and ensure the reliability of the electrical connection between the at least one first wiring L1 and the at least one second wiring 103.

For example, in some embodiments, in the stack structure in a direction perpendicular to a plate surface of the base substrate 10 (i.e., the vertical direction in the figure), a thickness of the second flexible substrate 102 is smaller than that of the first flexible substrate 101 in the vertical direction, which enables the at least one second wiring 103 to be located at the position of the neutral layer in the bending region B. Because the elastic modulus of the first flexible substrate 101 and the elastic modulus of the second flexible substrate 102 in the base substrate 10 are much larger than those of other films on the base substrate 10, the thickness of the base substrate 10 has a great effect on the neutral layer in the bending region. As shown in FIG. 2, under the condition that the stack structure and the materials of the display substrate are unchanged, as the thickness of the base substrate 10 increases, the position of the neutral layer will gradually move away from a second interlayer insulation layer 107, for example, move from the second flexible substrate 102 to the second wiring 103.

For example, in some embodiments, the thickness of the second flexible substrate 102 is in a range of 6 μm-10 μm, such as 6 μm, 7 μm, 8 μm, or 9 μm; the thickness of the first flexible substrate 101 is in a range of 9 μm-11 μm, such as 10 μm.

For example, in some embodiments, the elastic modulus of the first flexible substrate 101 and the elastic modulus of the second flexible substrate 102 are the same, they are ranging from 6.5 Gpa to 10.5 Gpa, such as 7 Gpa, or 8 Gpa. For example, both the material of the first flexible substrate 101 and the material of the second flexible substrate 102 may be flexible materials, such as polyimide (PI), and the specific materials of the first flexible substrate 101 and the second flexible substrate 102 are not limited in the embodiments of the present disclosure.

For example, in some embodiments, a material of the second wiring 103 includes one or more selected from a group consisting of titanium, aluminum, copper, and molybdenum, for example, the second wiring 103 is formed as a single-layer metal structure or a multi-layer metal structure, such as titanium/aluminum/titanium or molybdenum/aluminum/molybdenum.

For example, as shown in FIG. 2 and FIG. 5, the display panel further includes a spacer layer 1018, an encapsulation layer EN, a first optical transparent adhesive layer 201, and a polarizer 202, etc. The spacer layer 1018 is located on a side of the pixel definition layer 1017 away from the base substrate 10, and the encapsulation layer EN is located on a side of the light emitting device layer away from the base substrate 10. For example, the encapsulation layer EN may be a single-layer structure or a multi-layer structure. For example, an example of the encapsulation layer EN with a multilayer structure may include a first inorganic encapsulation layer 1051, a first organic encapsulation layer 1052, and a second inorganic encapsulation layer 1053 that are sequentially stacked in the direction away from the base substrate 10, thereby the encapsulation layer EN may form multilayer encapsulation to protect the functional structures in the display panel. For example, the structures from the base substrate 10 to the encapsulation layer EN (including the base substrate 10 and the encapsulation layer EN) together form a display substrate 100.

For example, a material of the gate electrode 1022, a material of the first capacitor electrode plate 1031 and a material of the second capacitor electrode plate 1032 include a metal material, such as aluminum, titanium, cobalt, and copper, or an alloy material thereof. The active layer 1021 of the transistor may be made of a material, such as polysilicon or metal oxide, etc. The gate insulation layer 1014 (including the first gate insulation layer 1014A and the second gate insulation layer 1014B), the interlayer insulation layer 1015, the first inorganic encapsulation layer 1051 of the encapsulation layer EN and the second inorganic encapsulation layer 1053 of the encapsulation layer EN may be made of an inorganic insulating material, such as silicon oxide, silicon nitride, or silicon oxynitride, etc. For example, the planarization layer 1016, the pixel definition layer 1017, the spacer layer 1018, and the first organic encapsulation layer 1052 of the encapsulation layer EN may adopt an organic insulating material, such as polyimide, resin, etc. The embodiments of the present disclosure do not limit the material of each functional layer, and the material of each functional layer are not limited to the above examples.

For example, in the display region A, the polarizer 202 is bonded to a side of the encapsulation layer EN away from the base substrate 10, that is, bonded to the display substrate 100, by the first optical transparent adhesive layer 201, and the first optical transparent adhesive layer 201 extends to the bending region B. For example, the first optical transparent adhesive layer 201 may include polymethyl methacrylate. In some embodiments, the first optical transparent adhesive layer 201 may also be called OCA (Optical Clear Adhesive). The first optical transparent adhesive layer 201 including polymethyl methacrylate can have a smaller thickness than MCL glue (Metal Cover Layer adhesive, namely protective glue of the bending region) including acrylic resin used in the bending region B in the conventional technology. For example, under normal circumstances, the thickness of the MCL glue is about in a range of 90 μm-120 μm to meet the bonding requirements, it is much thicker than the thickness of the display substrate 100 (usually about 30 μm in thickness). In this way, the MCL glue enlarges the frame of the display panel. In addition, after the bending region B is bent, the MCL glue will change the position of the neutral layer in the bending region B after the bending region B is bent, which causes the second wiring 103 to be away from the position of the neutral layer. Furthermore, the thickness uniformity of the MCL glue is poor, which easily causes undesirable phenomena, such as poor adhesion.

In at least one embodiment of the present disclosure, the first optical transparent adhesive layer 201 including polymethyl methacrylate is adopted to bond with the polarizer 202, and the first optical transparent adhesive layer 201 is extended to the bending region B. Compared with the MCL glue used in the bending region B in the conventional technology, the first optical transparent adhesive layer 201 can realize the bonding function and the protection function with a smaller thickness. For example, in some embodiments, the thickness of the first optical transparent adhesive layer in the direction perpendicular to the plate surface of the base substrate 10 is about in a range of 27 μm to 33 μm, such as 30 μm. In this way, after the bending region B is bent, the first optical transparent adhesive layer 201 has a smaller bending radius R, which can significantly reduce the frame of the display panel; moreover, the thickness uniformity of the first optical transparent adhesive layer 201 is very good, and the thickness of the first optical transparent adhesive layer 201 can be controlled within ±10% of the designed thickness, which is easier to be controlled than the MCL glue; moreover, the first optical transparent adhesive layer 201 basically does not affect the position of the neutral layer, enable the second wiring 103 to be located at the position of the neutral layer after the bending region B is bent, thus ensuring the reliability of the bending of the bending region B.

Figure 9:
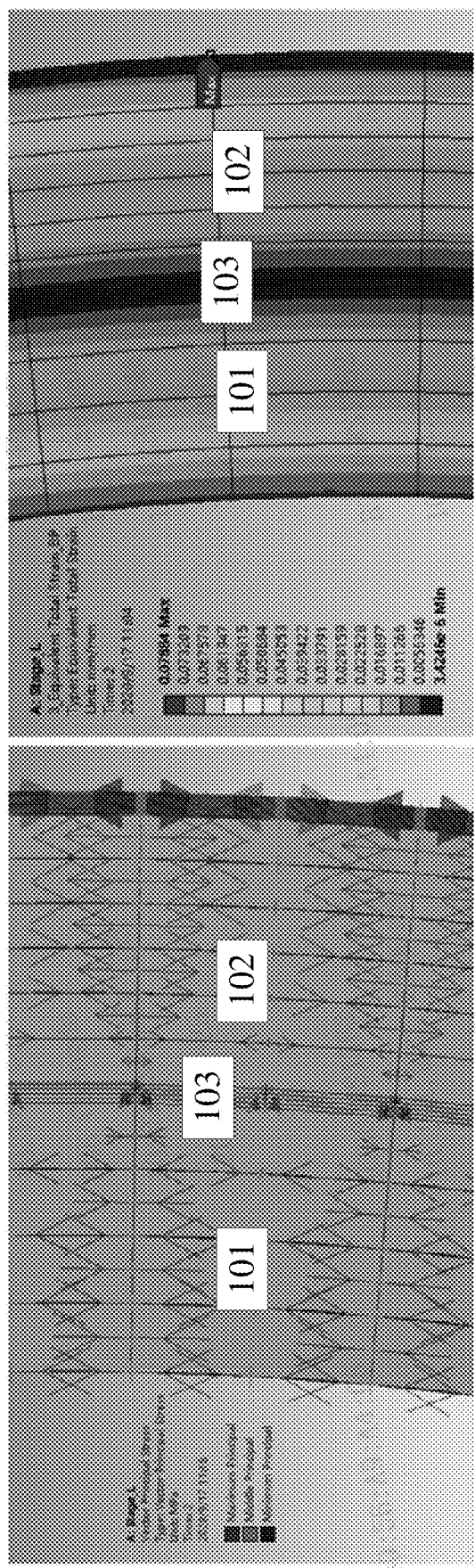
FIG. 9 is a result diagram of a finite element analysis experiment of a display panel provided by at least one embodiment of the present disclosure.

For example, in at least one embodiment, the finite element analysis (FEA) experiment is performed on the stack structure of the bending region B of the display panel shown in FIGS. 1-5. FIG. 9 shows the result of the finite element analysis experiment, the result of the finite element analysis experiment shows that the neutral layer is just at the position of the second wiring 103. The maximum strain value of the second wiring 103 is one order of magnitude lower than that of the conventional technology (for example, the second wiring is on a side of the second flexible substrate away from the first flexible substrate). It can be seen that according to the above structure provided by the embodiments of the present disclosure, the bending radius R of the bending region can be reduced to be very small, for example, below 0.2 mm, which is much smaller than the bending radius of the bending region in the conventional display panel.

For example, in some embodiments, as shown in FIG. 2 and FIG. 3, the display panel may further include a back film 301 disposed on a side of the first flexible substrate 101 away from the second flexible substrate 102. For example, the back film 301 includes a second hollow part 301A at least partially in the bending region B. For example, in some examples, the range of the second hollow part 301A is the same as that of the bending region B, that is, as illustrated in FIG. 2, the width of the second hollow part 301A is the same as that of the bending region B. For example, a material of the back film 301 may include polyethylene terephthalate (PET), or polyimide (PI), etc.

For example, in some embodiments, as shown in FIG. 2, the first optical transparent adhesive layer 201 extends to a position between an edge of the first hollow part EB away from the display region A and an edge of the second hollow part 301A away from the display region A, in a direction parallel to the plate surface of the base substrate 10 (that is, the horizontal direction in the figure), that is, in the horizontal direction in FIG. 2, the right edge of the first optical transparent adhesive layer 201 is between the right edge of the first hollow part EB and the right edge of the second hollow part 301A. In this way, the first optical transparent adhesive layer 201 can protect the bending region B of the display substrate, and the first optical transparent adhesive layer 201 can bend with the bending of the bending B.

Figure 10A:
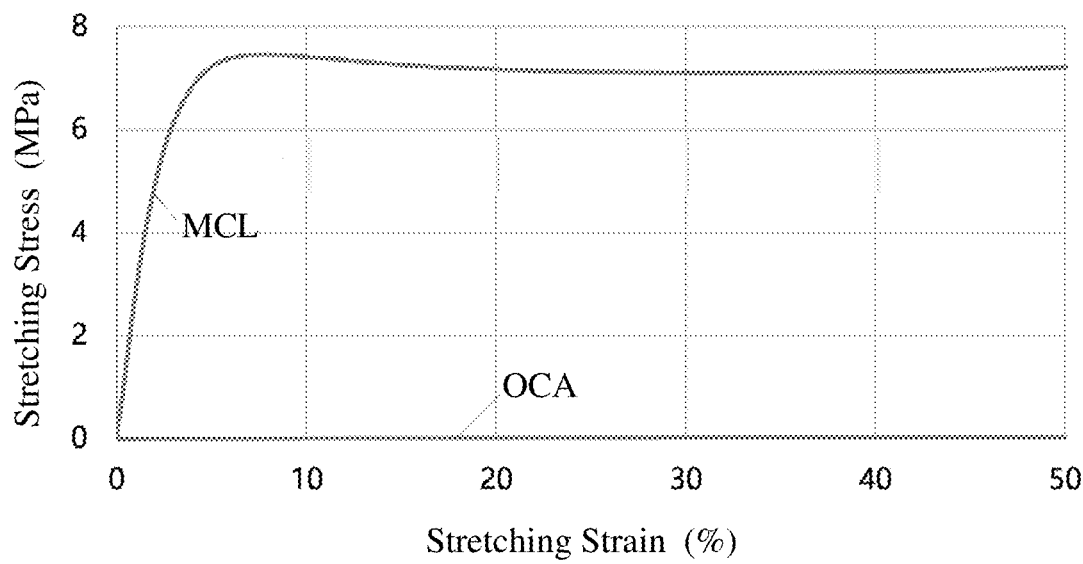
FIG. 10A is a stress-strain chart of OCA and MCL glue obtained by experiments in at least one embodiment of the present disclosure.
Figure 10B:
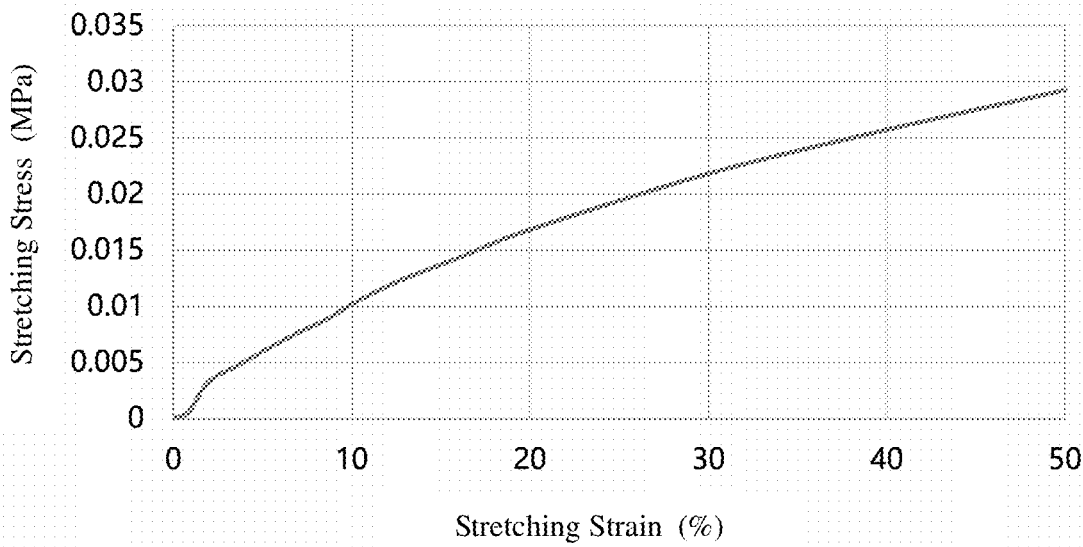
FIG. 10B is a stress-strain chart of OCA obtained by experiments in at least one embodiment of the present disclosure.

For example, FIG. 10A shows the stress-strain chart of the OCA and the MCL glue; FIG. 10B is the stress-strain chart of the OCA. As shown in FIG. 10A and FIG. 10B, compared with the MCL glue, the OCA has a larger difference in modulus, and the OCA is much softer than the MCL glue, thus in the bending process of the bending region B, the first optical transparent adhesive layer 201 (OCA) can be bent first, and then be cured. In this case, for example, before a curing process by light is performed, the neutral layer of the bending region B cannot shift significantly due to the OCA, and the effect of the OCA can be ignored. After the bending region B is bent and the first optical transparent adhesive layer 201 is cured by light, the position of the neutral layer is not changed basically, but the first optical transparent adhesive layer 201 has the function of reinforcing and protecting the bending region B. Naturally, the OCA is relatively soft, and even if light curing (such as ultraviolet curing) is added, the modulus of the first optical transparent adhesive layer 201 including the OCA is still much smaller than that of the MCL glue; in addition, because the material of the OCA is soft, the OCA usually does not need a UV curing or a secondary curing for conventional products after the OCA bonding process is completed. According to the embodiments provided by the present disclosure, the addition operation of the curing process after the bending region is bent can make the adhesive harder and enhance the reliability of the bending region of the product, and the surface adhesion of the bending region B can be further reduced after the OCA in the bending region B is cured, so that foreign matters are prevented from adhering to the surface of the OCA in the bending region B, and the OCA can also achieve the effect of blocking water and oxygen.

For example, in some embodiments, as shown in FIG. 2, an interlayer insulation layer is in at least part of the first peripheral region N1 and the bending region B, and the interlayer insulation layer is between the first optical transparent adhesive 201 and the second flexible substrate 102. For example, the interlayer insulation layer is in a same layer as at least one of the planarization layer 1016 and the pixel definition layer 1017. For example, in some examples, the interlayer insulation layer includes a first interlayer insulation sub-layer 106 and a second interlayer insulation sub-layer 107, and the first interlayer insulation sub-layer 106 and the second interlayer insulation sub-layer 107 respectively are in the same layer as the planarization layer 1016 and the pixel definition layer 1017. Or, in other examples, the interlayer insulation layer may have only one layer, and in this case, the interlayer insulation layer may be in the same layer as the planarization layer 1016 or the pixel definition layer 1017. Or, in further other examples, the interlayer insulation layer may include more sub-layers, for example, the interlayer insulation layer further includes an insulation sub-layer 109, these sub-layers are in same layers as some insulation layers in the display region A in one-to-one correspondence. The embodiments of the present disclosure do not limit the specific form of the interlayer insulation layer.

For example, in some embodiments, the display panel further includes a second peripheral region N2 located on the side of the bending region B away from the display region A. The first optical transparent adhesive layer 201 extends into the second peripheral region N2, so that the first optical transparent adhesive layer 201 can also protect the structure of the display substrate 100 in the second peripheral region N2.

For example, in some embodiments, referring to FIG. 1, at the positions of the left border, the right border, and the upper border of the display substrate, a retraction distance of the first optical transparent adhesive layer 201 relative to the left edge, the right edge, and the upper edge of the base substrate 10 is in a range of 0-0.3 mm, such as 0.2 mm-0.3 mm, so as to prevent the first optical transparent adhesive layer 201 from overflowing out of the base substrate 10 during the manufacturing process of the display panel. At the position of the lower frame of the display substrate, as shown in FIG. 2, the first optical transparent adhesive layer 201 is retracted by a distance H1 relative to the edge of the base substrate 10. For example, for a large-sized display substrate, such as a display substrate for a tablet computer or a notebook computer, the distance H1 is at least 4 mm, for a medium-sized display substrate, such as a display substrate for a mobile phone, the distance H1 is at least 3 mm, and for a small-sized display substrate, for example, a display substrate for watches, the distance H1 is at least 2 mm, that is, the distance between the right edge of the first optical transparent adhesive layer 201 and the right edge of the base substrate 10 in the horizontal direction of FIG. 2 is at least 4 mm, or 3 mm or 2 mm.

For example, the second peripheral region N2 includes a bonding region with a plurality of connecting fingers, and a distance between the first optical transparent adhesive layer 201 and the connecting fingers is greater than 1 mm.

For example, in some embodiments, as shown in FIG. 2, the display panel further includes a second optical transparent adhesive layer 203 and a cover plate 204, the cover plate 204 is bonded to the polarizer 202 by the second optical transparent adhesive layer 203, and covers the display region A and at least part of the bending region B. For example, the cover plate 204 is a transparent cover plate, such as a transparent glass cover plate, for protecting the display panel. For example, the second optical transparent adhesive layer 203 may include polymethyl methacrylate.

For example, in some embodiments, as shown in FIG. 2, the second optical transparent adhesive layer 203 is retracted by a distance H2 relative to an edge of the polarizer 202 near the bending region B, for example, the distance H2 is at least 0.2 mm, that is, in the horizontal direction in FIG. 2, the distance between the right edge of the second optical transparent adhesive layer 203 and the right edge of the polarizer 202 is at least 0.2 mm, so as to prevent the second optical transparent adhesive layer 203 from overflowing out of polarizer 202 of the display substrate during the manufacturing process of the display panel.

For example, as shown in FIG. 2, the display panel may further include a heat dissipation film (e.g., SCF) 302 disposed on a side of the back film 301 away from the first flexible substrate 101 and a spacer 303 disposed on a side of the heat dissipation film 302 away from the back film 301. For example, the heat dissipation film 302 may be made of copper foil, etc., and the spacer 303 may be made of organic materials, such as optical transparent adhesives. As shown in FIG. 4, after the bending region B is bent, the spacer 303 is spaced between parts of the back film 301 on different sides of the second hollow part 301A, so as to bond the parts of the back film 301 on the different sides of the second hollow part 301A.

Figure 11:
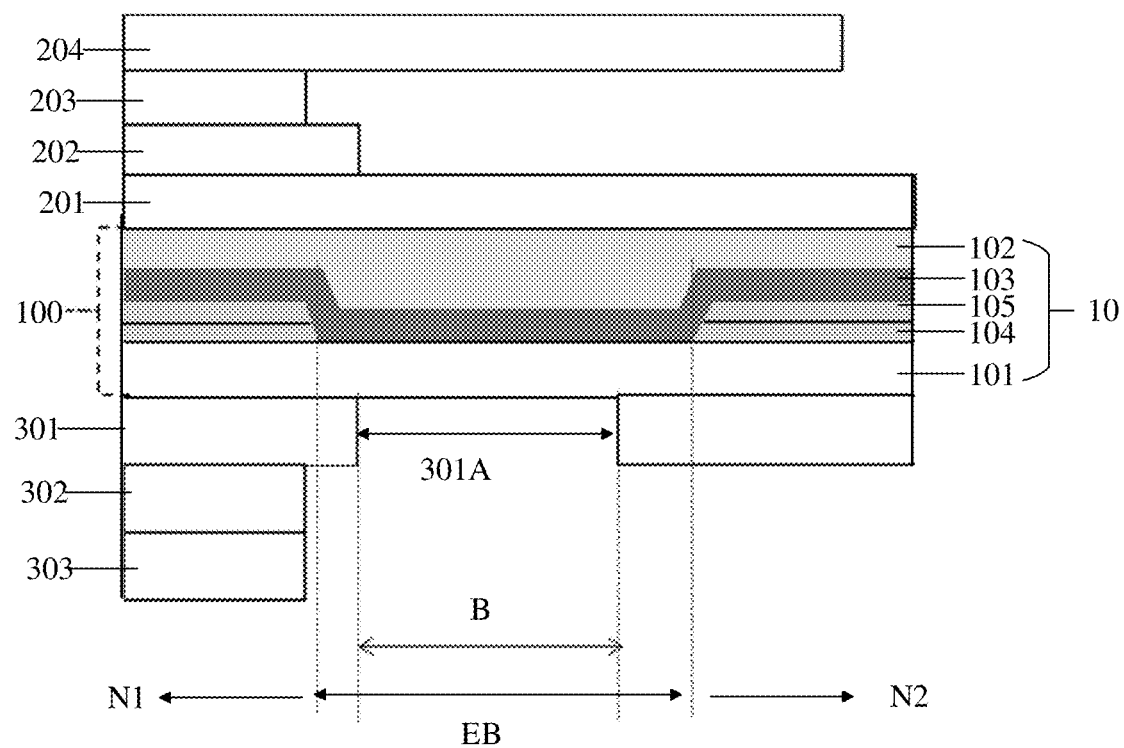
FIG. 11 is another sectional view of the display panel in FIG. 1 taken along the line MM.

For example, in other embodiments, FIG. 11 shows another schematic sectional view of the display panel in FIG. 1 taken along the line MM.

Figure 12:
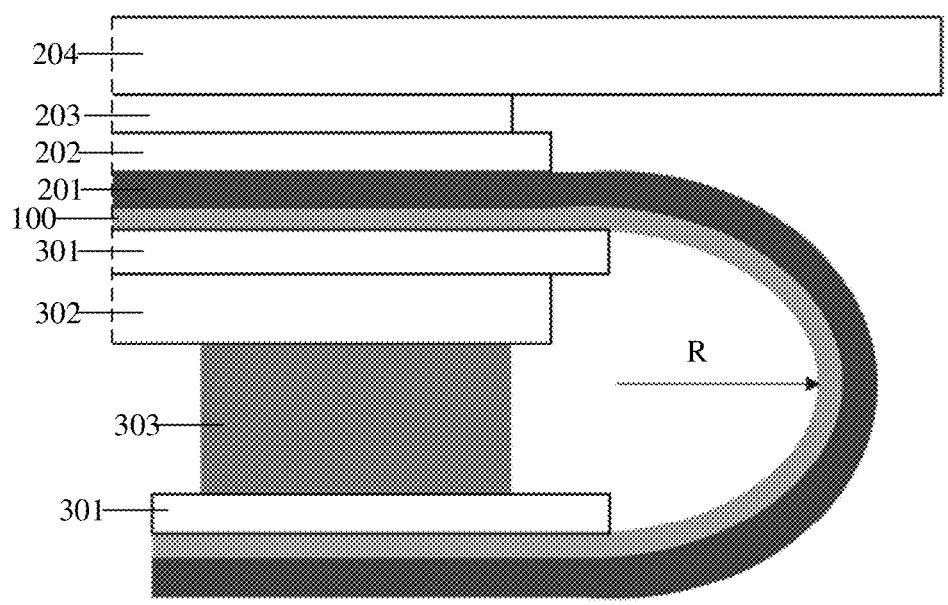
FIG. 12 is a schematic cross-sectional view of the display panel in FIG. 11 after the bending region is bent.

As shown in FIG. 11, in at least part of the first peripheral region N1 and the bending region B, the first optical transparent adhesive 201 directly contacts the second flexible substrate 102, that is, no interlayer insulation layer is provided on the second flexible substrate 102. In this case, because the thickness of the above-mentioned interlayer insulation layer is at least one order of magnitude smaller than the thickness of the first flexible substrate 101 and the thickness of the second flexible substrate 102, and the elastic modulus of the interlayer insulation layer is much smaller than the elastic modulus of the first flexible substrate 101 and the elastic modulus of the second flexible substrate 102, the removal of the interlayer insulation layer has little effect on the position of the neutral layer which can be ignored; moreover, removing the interlayer insulation layer can also reduce the thickness of the bending region B, so that after the bending region B is bent, the frame width of the display panel can also be decreased, as shown in FIG. 12 which is a schematic sectional view of the display panel illustrated in FIG. 11 after the bending region is bent.

For example, as shown in FIG. 1 and FIG. 11, in this embodiment, the display panel further includes a second peripheral region N2 located on the side of the bending region B away from the display region A, and the first optical transparent adhesive layer 201 extends into the second peripheral region N2, so that the first optical transparent adhesive layer 201 can also protect the structure of the display substrate 100 in the second peripheral region N2.

For example, in the embodiment shown in FIG. 11, referring to FIG. 1, at the positions of the left edge, the right edge and the upper edge of the display substrate, a retraction distance of the first optical transparent adhesive layer 201 respectively relative to the left edge, the right edge, and the upper edge of the base substrate 10 is in a range of 0-0.3 mm, such as 0.2 mm-0.3 mm, so as to avoid the first optical transparent adhesive layer 201 from overflowing outside the base substrate 10 during the manufacturing process of the display panel. At the position of the lower frame of the display substrate, the first optical transparent adhesive layer 201 is retracted by a given distance relative to the edge of the base substrate 10. For example, for a large-sized display substrate, such as a display substrate for tablet computers or notebook computers, the retraction distance is at least 4 mm, for a medium-sized display substrate, such as a display substrate for mobile phones, the retraction distance is at least 3 mm, and for a small-sized display substrate, such as a display substrate for watches, the retraction distance is at least 2 mm, that is, the distance between the right edge of the first optical transparent adhesive layer 201 and the right edge of the base substrate 10 in the horizontal direction of FIG. 2 is at least 4 mm, or 3 mm, or 2 mm. For example, the second peripheral region N2 includes a bonding region with a plurality of connecting fingers, and a distance between the first optical transparent adhesive layer 201 and the connecting fingers is greater than 1 mm.

The display panel further includes a second optical transparent adhesive layer 203 and a cover plate 204, and the cover plate 204 is bonded to the polarizer 202 by the second optical transparent adhesive layer 203 and covers the display region A and at least part of the bending region B. The second optical transparent adhesive layer 203 is retracted by at least 0.2 mm relative to an edge of the polarizer 202 near the bending region B.

For the display panel shown in FIG. 11 and FIG. 12, other structures can refer to the embodiments described in FIGS. 1-8 above, which are not repeated here.

Figure 13:
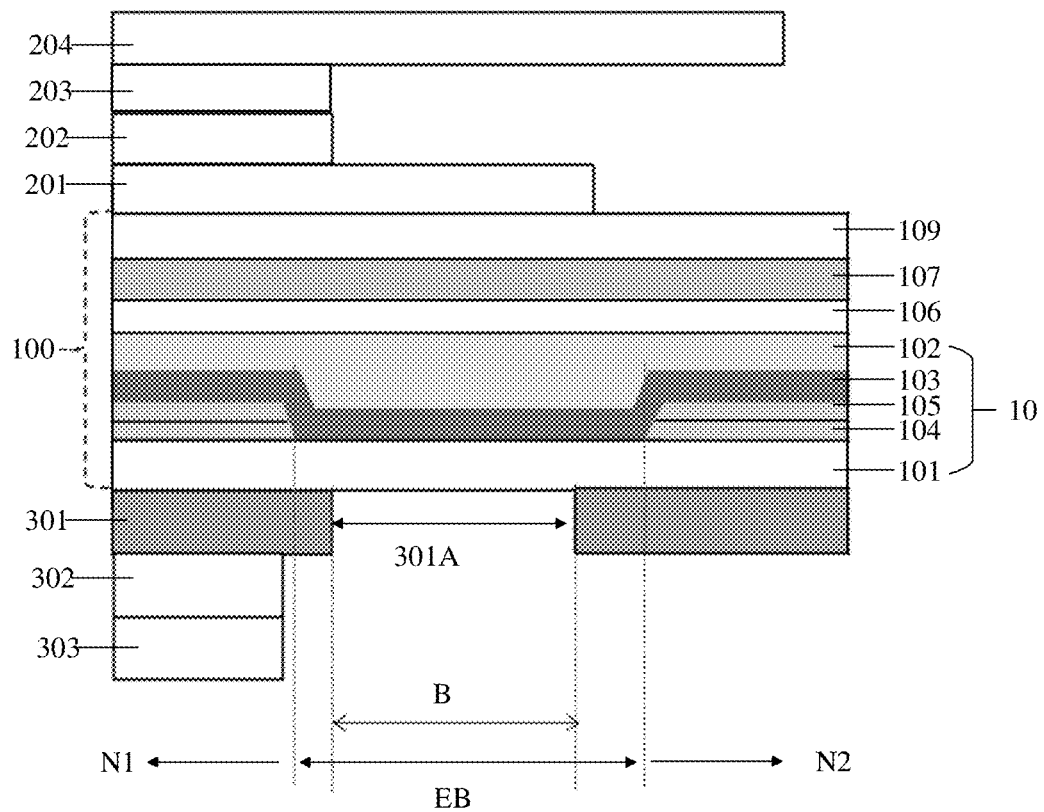
FIG. 13 is further another schematic sectional view of the display panel in FIG. 1 taken along the line MM.

For example, in other embodiments, FIG. 13 shows yet another schematic sectional view of the display panel in FIG. 1 taken along the line MM. As shown in FIG. 13, the edge of the second optical transparent adhesive layer 203 and the edge of the polarizer 202 (for example, the right edge of the two shown in the figure) may be flush with each other. Because the polarizer 202 is retracted at least 0.2 mm relative to the edge of the first optical transparent adhesive layer 201, even if the second optical transparent adhesive layer 203 overflows out slightly, the bending of the bending region B will not be affected. For example, referring to FIG. 1, at the positions of the left edge, the right edge, and the upper edge of the display substrate, a retraction distance of the first optical transparent adhesive layer 201 respectively relative to the left edge, the right edge, and the upper edge of the base substrate 10 is in a range of 0-0.3 mm, such as 0.2 mm-0.3 mm, so as to prevent the first optical transparent adhesive layer 201 from overflowing out of the base substrate 10 during the manufacturing process of the display panel. At the position of the lower frame of the display substrate, the first optical transparent adhesive layer 201 is retracted by a given distance relative to the edge of the base substrate 10, for example, for a large-sized display substrate, such as a display substrate for tablet computers or notebook computers, the retraction distance is at least 4 mm, for a medium-sized display substrate, such as a display substrate for mobile phones, the retraction distance is at least 3 mm, and for a small-sized display substrate, such as a display substrate for watches, the retraction distance is at least 2 mm, that is, the distance between the right edge of the first optical transparent adhesive layer 201 and the right edge of the base substrate 10 in the horizontal direction of FIG. 2 is at least 4 mm, or 3 mm, or 2 mm. For example, the second peripheral region N2 includes a bonding region with a plurality of connecting fingers, and a distance between the first optical transparent adhesive layer 201 and the connecting fingers is greater than 1 mm. For example, FIG. 14 shows a schematic diagram of the display panel in FIG. 13 after the bending region B is bent.

Figure 14:
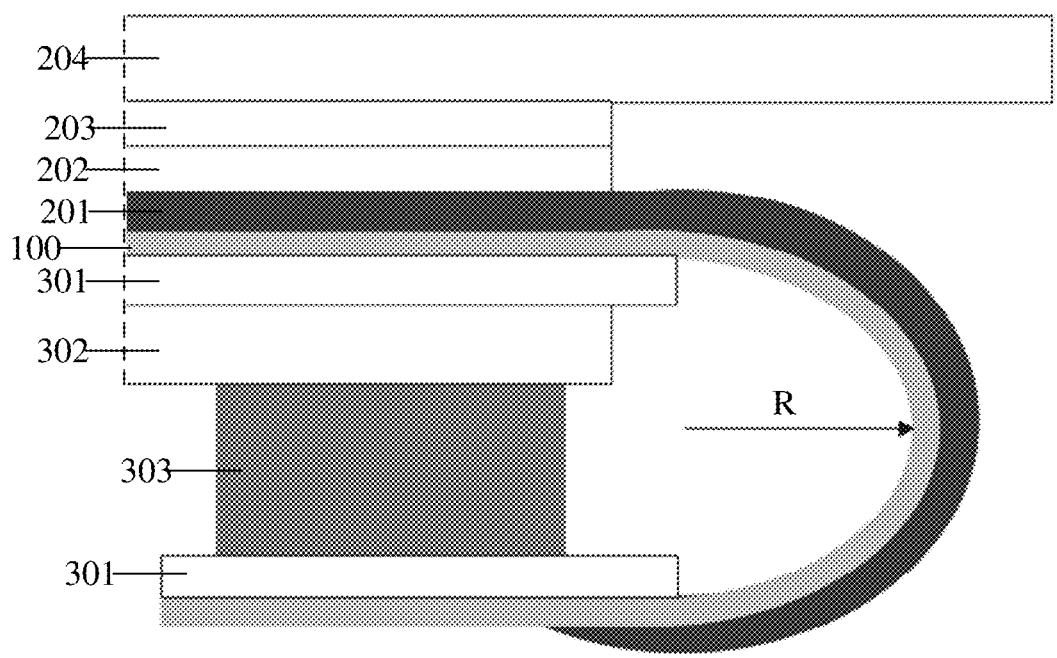
FIG. 14 is a schematic cross-sectional view of the display panel in FIG. 13 after the bending region is bent.

For the display panel shown in FIG. 13 and FIG. 14, other structures can refer to the embodiments described in FIGS. 1-8 above, and are not repeated here.

In the display panel provided by at least one the embodiment of the present disclosure, the at least one second wiring in the bending region is between the first flexible substrate and the second flexible substrate, and after the bending region is bent, the at least one second wiring is near or located at the position of the neutral layer, so that the stress subjected by the at least one second wiring can be reduced or eliminated, thereby reducing or eliminating the risk of breakage of the at least one second wiring and improving the reliability and production yield of the display panel.

At least one embodiment of the disclosure also provides a manufacturing method of a display panel, the display panel includes a display region and a bending region at a side of the display region, and the manufacturing method includes: providing a base substrate, in which the base substrate includes a first flexible substrate and a second flexible substrate that are stacked on each other; forming a driver circuit layer in the display region, the driver circuit layer is formed at a side of the second flexible substrate away from the first flexible substrate and includes at least one first wiring, forming at least one second wiring in the bending region, the at least one second wiring is electrically connected with the at least one first wiring, and the at least one second wiring is formed between the first flexible substrate and the second flexible substrate.

For example, in some embodiments, the step of providing the base substrate includes: providing the first flexible substrate, and sequentially forming a buffer layer, the at least one second wiring, and the second flexible substrate on the first flexible substrate to form the base substrate.

Then, the manufacturing method of the display panel may further include: forming functional layers such as the driver circuit layer, a light emitting device layer, an encapsulation layer, etc. in the display region of the base substrate. The specific formation methods of these functional layers can refer to the related technologies, which are not repeated here.

For example, the manufacturing method of the display panel further includes: bonding the polarizer to the base substrate by the first optical transparent adhesive layer, that is, the base substrate on which the functional layers, such as the driver circuit layer, the light emitting device layer, and the encapsulation layer are formed. For example, first, the first optical transparent adhesive may be coated on the base substrate (e.g., on the encapsulation layer) on which the functional layers, such as the driver circuit layer, the light emitting device layer, and the encapsulation layer are formed, so as to form the first optical transparent adhesive layer. During the process of coating the first optical transparent adhesive, the first optical transparent adhesive may be kept to be retracted by a given distance relative to the corresponding edge of the base substrate (refer to the above-mentioned embodiment specifically) to avoid the overflow of the first optical transparent adhesive, and then place the polarizer on the first optical transparent adhesive layer, so as to bond the polarizer to the base substrate by the first optical transparent adhesive layer.

For example, the manufacturing method of the display panel further includes: bonding the cover plate to the polarizer by a second optical transparent adhesive layer. For example, first, a second optical transparent adhesive may be coated on the polarizer to form a second optical transparent adhesive layer. In the process of coating the second optical transparent adhesive, the second optical transparent adhesive may be kept to be retracted by a distance of at least 0.2 mm relative to the corresponding edge of the polarizer, or, the edge of the second optical transparent adhesive is flush with the corresponding edge of the polarizer, so as to prevent the second optical transparent adhesive from overflowing out, and then the cover plate is placed on the second optical transparent adhesive layer, so as to combine the cover plate with the polarizer by the second optical transparent adhesive layer.

For example, in some embodiments, after the polarizer and the cover plate are disposed, the manufacturing method of the display panel further includes: bending the bending region, and then curing the first optical transparent adhesive layer. In the conventional technology, the first optical transparent adhesive layer is cured first and then bent, at this point, the firstly cured optical transparent adhesive layer is hard, therefore if the firstly cured optical transparent adhesive layer is bent, the position of the neutral layer in the bending region will be affected by the bending. On the contrary, the embodiments of the present disclosure adopt the manufacturing process of bending the first optical transparent adhesive layer first and then curing the first optical transparent adhesive layer, and in this case, the first optical transparent adhesive layer basically does not change the position of the neutral layer, and moreover, the first optical transparent adhesive layer has the function of reinforcing and protecting the bending region B.

For example, in some embodiments, curing the first optical transparent adhesive layer includes: curing the first optical transparent adhesive layer by light curing, or, spraying a catalyst on a surface of the first optical transparent adhesive layer to cure the first optical transparent adhesive layer.

Figure 15:
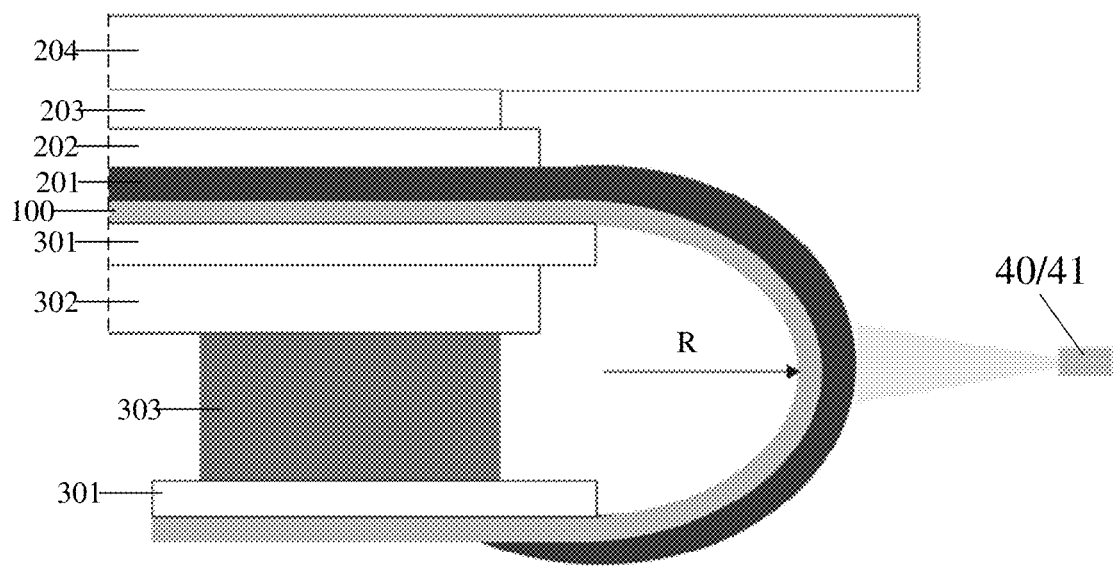
FIG. 15 is a schematic cross-sectional view of a display panel provided by at least one embodiment of the present disclosure during a manufacturing process thereof.

For example, as shown in FIG. 15, in some examples, the first optical transparent adhesive layer 201 may be cured by irradiating ultraviolet light adopting an illuminating device 40; or, a spraying device 41 is used to spray a catalyst on the surface of the first optical transparent adhesive layer 201. After the catalyst contacts the surface of the first optical transparent adhesive layer 201, the molecular structure of the material of the first optical transparent adhesive layer 201 is destroyed, and the first optical transparent adhesive layer 201 is hardened, thereby curing the first optical transparent adhesive layer 201. For example, the catalyst can be any catalyst that can achieve the above functions, and the specific types of catalysts are not limited in the embodiments of the present disclosure.

For example, the manufacturing method of the display panel may further include other manufacturing processes which can refer to related technologies, and are not described in detail in the embodiments of the present disclosure.

The following several points should be noted:
(1) The accompanying drawings involve only the structure(s) in connection with the embodiment(s) of the present disclosure, and other structure(s) can refer to common design(s).
(2) For clarity, in the accompanying drawings for illustrating the embodiment(s) of the present disclosure, the thickness of a layer or a region may be enlarged or decreased, that is, the drawings are not drawn in an actual scale. It is to be understood that, when a component, such as a layer, film, region, substrate, or the like, is referred to be "on" or "under" another component, the component may be directly on or under the another component, or a third component is interposed therebetween.

(3) Without conflicting with each other, embodiments of the present disclosure and the features in the embodiments may be mutually combined to obtain new embodiments.

The above descriptions are only exemplary embodiments of the present disclosure, but the scope of the present disclosure is not limited thereto, the scope of the present disclosure should be defined by the claims.

What is claimed is:

1. A display panel, comprising a display region and a bending region at a side of the display region, and a base substrate, wherein the base substrate comprises a first flexible substrate and a second flexible substrate stacked on each other;
the display region comprises a driver circuit layer, the driver circuit layer is at a side of the second flexible substrate away from the first flexible substrate and comprises at least one first wiring,
the bending region comprises at least one second wiring, and the at least one second wiring is electrically connected with the at least one first wiring, and
the at least one second wiring is between the first flexible substrate and the second flexible substrate.

2. The display panel according to claim 1, wherein the at least one second wiring is at a position of a neutral layer in the bending region when the bending region is in a bending state.

3. The display panel according to claim 1, wherein the base substrate further comprises a buffer layer between the first flexible substrate and the second flexible substrate, the buffer layer includes a first hollow part at least partially in the bending region, and the at least one second wiring is between the buffer layer and the second flexible substrate and extends to pass through the first hollow part.

4. The display panel according to claim 1, further comprising a first peripheral region between the display region and the bending region,
wherein the second flexible substrate includes a via hole in the first peripheral region, and the at least one first wiring is electrically connected with the at least one second wiring through the via hole.

5. The display panel according to claim 4, wherein the driver circuit layer comprises a thin film transistor and a storage capacitor, the thin film transistor comprises a gate electrode and source and drain electrodes, and the storage capacitor comprises a first capacitor electrode and a second capacitor electrode; the second capacitor electrode is on a side of the first capacitor electrode away from the base substrate, and the source and drain electrodes is on a side of the second capacitor electrode away from the base substrate; and
the at least one first wiring and the source and drain electrodes are in a same layer.

6. The display panel according to claim 5, wherein the first peripheral region comprises a first connection electrode in a same layer as the first capacitor electrode, and the at least one first wiring is electrically connected with the at least one second wiring through the via hole comprises:
the at least one first wiring is electrically connected with the first connection electrode, and the first connection electrode is electrically connected with the at least one second wiring through the via hole;
or,
the first peripheral region comprises a second connection electrode in a same layer as the second capacitor electrode, and the at least one first wiring is electrically connected with the at least one second wiring through the via hole comprises:
the at least one first wiring is electrically connected with the second connection electrode, and the second connection electrode is electrically connected with the at least one second wiring through the via hole;
or,
the first peripheral region comprises a first connection electrode in a same layer as the first capacitor electrode and a second connection electrode in a same layer as the second capacitor electrode, and the at least one first wiring is electrically connected with the at least one second wiring through the via hole comprises:
the at least one first wiring is electrically connected with the second connection electrode, the second connection electrode is electrically connected with the first connection electrode, and the first connection electrode is electrically connected with the at least one second wiring through the via hole.

7. The display panel according to claim 4, further comprising a light emitting device layer, an encapsulation layer, a first optical transparent adhesive layer, and a polarizer, wherein the light emitting device layer is on a side of the driver circuit layer away from the base substrate, and the encapsulation layer is on a side of the light emitting device layer away from the base substrate,
in the display region, the polarizer is bonded to a side of the encapsulation layer away from the base substrate by the first optical transparent adhesive layer, and the first optical transparent adhesive layer extends to the bending region;
the first optical transparent adhesive layer comprises polymethyl methacrylate.

8. The display panel according to claim 7, wherein a thickness of the first optical transparent adhesive layer is in a range of 27 μm-33 μm in a direction perpendicular to a plate surface of the base substrate.

9. The display panel according to claim 7, further comprising a back film on a side of the first flexible substrate away from the second flexible substrate,
wherein the back film includes a second hollow part at least partially in the bending region.

10. The display panel according to claim 9, wherein, in a direction parallel to a plate surface of the base substrate, the first optical transparent adhesive layer extends to a position between an edge of the first hollow part away from the display region and an edge of the second hollow part away from the display region.

11. The display panel according to claim 7, wherein an interlayer insulation layer is provided in at least part of the first peripheral region and the bending region, and between the first optical transparent adhesive layer and the second flexible substrate;
the display region further comprises:
a planarization layer on a side of the driver circuit layer away from the second flexible substrate; and
a pixel definition layer on a side of the planarization layer away from the second flexible substrate,
wherein the light emitting device layer comprises a plurality of light emitting devices, each of the light emitting devices comprises a first electrode, a light emitting layer, and a second electrode that are sequentially stacked in a direction away from the base substrate, the driver circuit layer comprises a plurality of pixel driver circuits, the first electrode is electrically connected with one of the pixel driver circuits through a via hole in the planarization layer, the pixel definition layer is at a side of the first electrode away from the base substrate and comprises a plurality of pixel openings, the plurality of pixel openings respectively expose the first electrodes of the plurality of light emitting devices, and the light emitting layers of the plurality of light emitting devices are respectively in the plurality of pixel openings; and the interlayer insulation layer is in a same layer as at least one of the planarization layer and the pixel definition layer.

12. The display panel according to claim 7, wherein the first optical transparent adhesive layer directly contacts the second flexible substrate in at least part of the first peripheral region and the bending region.

13. The display panel according to claim 7, further comprising a second peripheral region on a side of the bending region away from the display region, wherein the first optical transparent adhesive layer extends into the second peripheral region.

14. The display panel according to claim 13, wherein the first optical transparent adhesive layer is retracted by at least 0.2 mm relative to an edge of the base substrate.

15. The display panel according to claim 14, further comprising a second optical transparent adhesive layer and a cover plate, wherein the cover plate is bonded to the polarizer through the second optical transparent adhesive layer, and covers the display region and at least part of the bending region; and the second optical transparent adhesive layer is retracted by at least 0.2 mm relative to an edge of the polarizer near the bending region.

16. The display panel according to claim 1, further comprising a second peripheral region on a side of the bending region away from the display region, wherein the second wiring passes through the bending region and extends to the second peripheral region.

17. The display panel according to claim 1, wherein the second flexible substrate has a thickness smaller than a thickness of the first flexible substrate in a direction perpendicular to a plate surface of the base substrate.

18. The display panel of claim 17, wherein the thickness of the second flexible substrate is in a range of 6 μm-10 μm, and the thickness of the first flexible substrate is in a range of 9 μm-11 μm.

19. The display panel according to claim 17, wherein the first flexible substrate has an elastic modulus same as an elastic modulus of the second flexible substrate, and the elastic modulus is in a range of 6.5Gpa-10.5Gpa.

20. The display panel according to claim 1, wherein the at least one second wiring comprises one or more materials selected from a group consisting of titanium, aluminum, copper, and molybdenum.

* * * * *